(12) United States Patent  (10) Patent No.: US 12,100,754 B2
Lin et al.  (45) Date of Patent: Sep. 24, 2024

(54) SEMICONDUCTOR ARRANGEMENT AND METHOD OF MAKING

(71) Applicant: TAIWAN SEMICONDUCTOR MANUFACTURING COMPANY LIMITED, Hsin-Chu (TW)

(72) Inventors: Chi-Fu Lin, Zhubei (TW); Cheng-Hsin Chen, Toufen (TW); Ming-I Hsu, Taoyuan (TW); Kun-Ming Huang, Taipei (TW); Chien-Li Kuo, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 147 days.

(21) Appl. No.: 17/215,268

(22) Filed: Mar. 29, 2021

(65) Prior Publication Data
US 2021/0343861 A1 Nov. 4, 2021

Related U.S. Application Data

(60) Provisional application No. 63/017,075, filed on Apr. 29, 2020.

(51) Int. Cl.
*H01L 29/739* (2006.01)
*H01L 21/225* (2006.01)
*H01L 29/06* (2006.01)
*H01L 29/10* (2006.01)
*H01L 29/66* (2006.01)

(52) U.S. Cl.
CPC ........ *H01L 29/7394* (2013.01); *H01L 21/225* (2013.01); *H01L 29/0696* (2013.01); *H01L 29/1095* (2013.01); *H01L 29/66325* (2013.01)

(58) Field of Classification Search
CPC .............. H01L 29/7394; H01L 21/225; H01L 29/0696; H01L 29/66325; H01L 29/1095
See application file for complete search history.

(56) References Cited

U.S. PATENT DOCUMENTS

| 5,135,880 A  * | 8/1992 | Fisher ................. H01L 29/7801 438/281 |
| 5,585,294 A    | 12/1996 | Smayling et al. |
| 2012/0032313 A1 * | 2/2012 | Yamamoto .......... H01L 27/0664 257/657 |

(Continued)

FOREIGN PATENT DOCUMENTS

| CN | 102376773 A | 3/2012 |
| CN | 110176486 A | 8/2019 |

(Continued)

OTHER PUBLICATIONS

First Office Action received in corresponding Chinese patent application No. 202110461917.1, dated Jun. 21, 2024, 18 pages.

*Primary Examiner* — Aaron J Gray
(74) *Attorney, Agent, or Firm* — Cooper Legal Group, LLC

(57) ABSTRACT

A semiconductor arrangement includes a first well formed to a first depth and a first width in a substrate and a second well formed to a second depth and a second width in the substrate. The first well is formed in the second well, the first depth is greater than the second depth, and the second width is greater than the first width. A source region is formed in the second well and a drain region is formed in the substrate.

20 Claims, 18 Drawing Sheets

(56) References Cited

U.S. PATENT DOCUMENTS

| | | | | |
|---|---|---|---|---|
| 2012/0299093 | A1* | 11/2012 | Kim | H01L 29/66689 |
| | | | | 257/335 |
| 2016/0293744 | A1* | 10/2016 | Tanaka | H01L 29/0808 |
| 2018/0350899 | A1* | 12/2018 | Wada | H01L 27/0629 |
| 2020/0013885 | A1 | 1/2020 | Stefanov | |
| 2021/0028166 | A1* | 1/2021 | Shin | H01L 27/088 |
| 2021/0305414 | A1* | 9/2021 | Huang | H01L 27/0248 |

FOREIGN PATENT DOCUMENTS

| | | |
|---|---|---|
| CN | 110690212 A | 1/2020 |
| TW | 201801318 A | 1/2018 |
| TW | I680534 B | 12/2019 |
| TW | I684284 B | 2/2020 |

* cited by examiner

SEMICONDUCTOR ARRANGEMENT AND METHOD OF MAKING

RELATED APPLICATION

This application claims priority to U.S. Provisional Patent Application 63/017,075, titled "SEMICONDUCTOR DEVICE WITH DEEP P-WELL BETWEEN LIGBTS" and filed on Apr. 29, 2020, which is incorporated herein by reference.

BACKGROUND

Semiconductor arrangements are used in a multitude of electronic devices, such as consumer products, industrial electronics, appliances, and aerospace and transportation devices. Some semiconductor arrangements include lateral insulated-gate bipolar transistors (LIGBTs). An LIGBT is a device that combines the input impedance and switching speed of a metal-oxide-semiconductor field-effect transistor (MOSFET) with the conductivity characteristics of a bipolar junction transistor (BJT).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
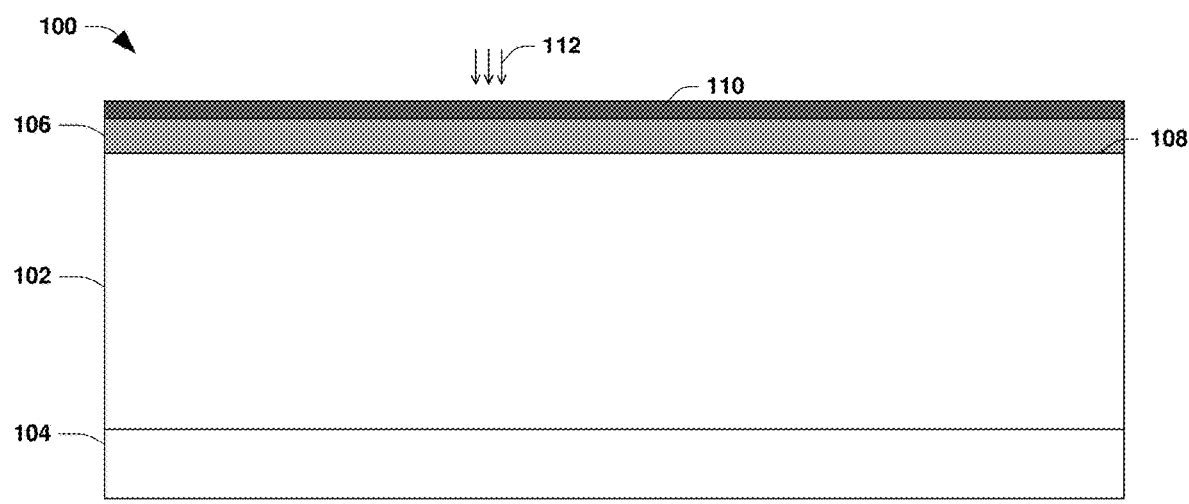
FIGS. 1-12 are cross-sectional views of a semiconductor arrangement at various stages of fabrication, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

One or more semiconductor arrangements are provided herein. A semiconductor arrangement includes a first well and a second well in a substrate. A portion of the second well overlaps the first well, and a portion of the first well extends below the second well and into the substrate. The first well is formed to a first depth and a first width in the substrate, and the second well is formed to a second depth and a second width in the substrate. The first depth is greater than the second depth and the second width is greater than the first width. The first well includes first conductive regions, and the second well includes second conductive regions. According to some embodiments, the first conductive regions are source regions and the second conductive regions are drain regions. A gate electrode overlies a portion of the second well and a portion of the substrate.

A voltage applied to the gate electrode generates an electric field in the substrate. A p-n junction at an interface of the first well and the substrate includes a depletion region. The depletion region is an insulation region that functions as a barrier to the electric field generated in the substrate. Compared to semiconductor arrangements that do not include a first well as described, the barrier at least partially contains the electric field to an area of the substrate and thereby reduces the strength of the electric field at other areas within the substrate. By reducing the strength of the electric field at other areas within the substrate, a breakdown voltage of the semiconductor arrangement is increased. By increasing the breakdown voltage, the safe operating area of the semiconductor arrangement is improved. According to some embodiments, the semiconductor arrangement comprises LIGBTs.

FIGS. 1-12 are cross-sectional views of a semiconductor arrangement 100 at various stages of fabrication, according to some embodiments.

Turning to FIG. 1, at least some of the semiconductor arrangement 100 is formed on a substrate 102. The substrate 102 may comprise at least one of an epitaxial layer, a silicon-on-insulator (SOI) structure, a wafer, or a die formed from a wafer. The substrate 102 is at least one of a p-type substrate (P-substrate) or an n-type substrate (N-substrate). The substrate 102 may comprise at least one of silicon, germanium, carbide, gallium, arsenide, germanium, arsenic, indium, oxide, sapphire, or other suitable materials.

According to some embodiments, the substrate 102 comprises a buried oxide layer 104. The buried oxide layer 104 may be a layer of silicon dioxide or other suitable material formed in the substrate 102 by implantation, diffusion, or other suitable techniques.

According to some embodiments, the semiconductor arrangement 100 comprises a barrier layer 106 overlying an upper surface 108 of the substrate 102. The barrier layer 106 may comprise at least one of a metal nitride, a high-k dielectric, a rare earth oxide, an aluminate of a rare earth oxide, a silicate of a rare earth oxide, or other suitable materials. In some embodiments, the barrier layer 106 comprises at least one of silicon nitride (SiN), silicon dioxide ($SiO_2$), titanium dioxide ($TiO_2$), tantalum pentoxide ($Ta_2O_5$), zirconium dioxide ($ZrO_2$), yttrium oxide ($Y_2O_3$), lanthana ($La_2O_5$), hafnium dioxide ($HfO_2$), or other suitable materials. The barrier layer 106 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques.

According to some embodiments, a photoresist layer 110 is formed over the barrier layer 106. The photoresist layer 110 comprises a light sensitive material such that properties, such as solubility, of the photoresist layer 110 are affected by light. The photoresist layer 110 is either a negative photoresist or a positive photoresist. With respect to a negative photoresist, a region of the negative photoresist becomes insoluble when illuminated by a light source 112 such that application of a solvent to the negative photoresist during a subsequent development stage removes non-illuminated regions of the negative photoresist. A pattern formed in the negative photoresist is thus a negative of a pattern defined by opaque regions of a template between the light source 112 and the negative photoresist. In a positive photoresist, illuminated regions of the positive photoresist become soluble when illuminated by the light source 112 and are removed via application of a solvent during development. Thus, a pattern formed in the positive photoresist is a positive image of opaque regions of a template between the light source 112 and the positive photoresist. The photoresist layer 110 may be formed by spin-coating or other suitable techniques.

Figure 2:
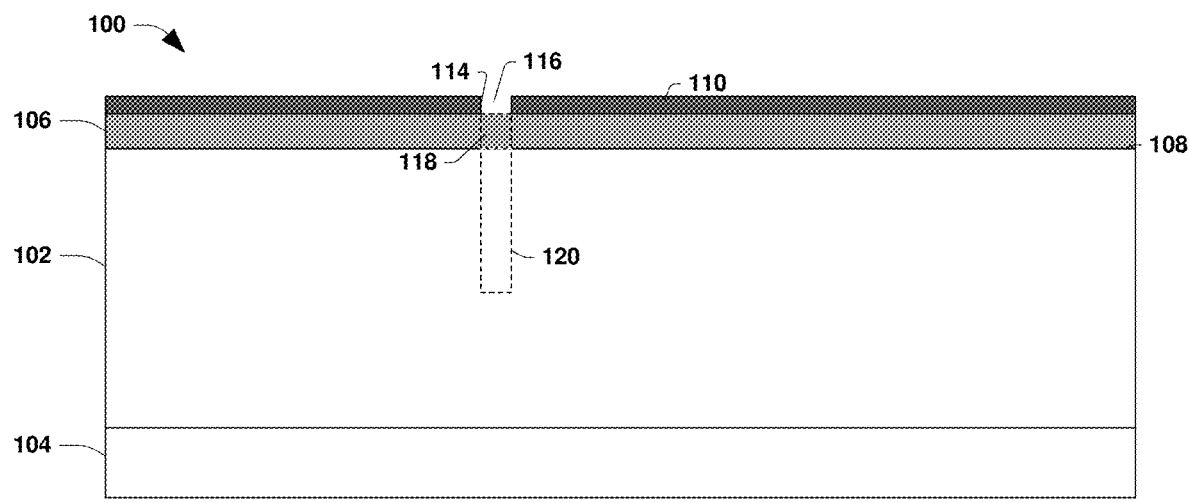

Referring to FIG. 2, after exposing the photoresist layer 110 to light from the light source 112, the photoresist layer 110 is developed to form an opening 116 defined by sidewalls 114 in the photoresist layer 110. The photoresist layer 110 may be developed by applying a developing solvent to the photoresist layer 110. The developing solvent may include sodium hydroxide (NaOH), potassium hydroxide (KOH), an organic solvent, or other suitable solvent. The opening 116 exposes a first area 118 of the barrier layer 106 over a first region 120 of the substrate 102.

Figure 3:
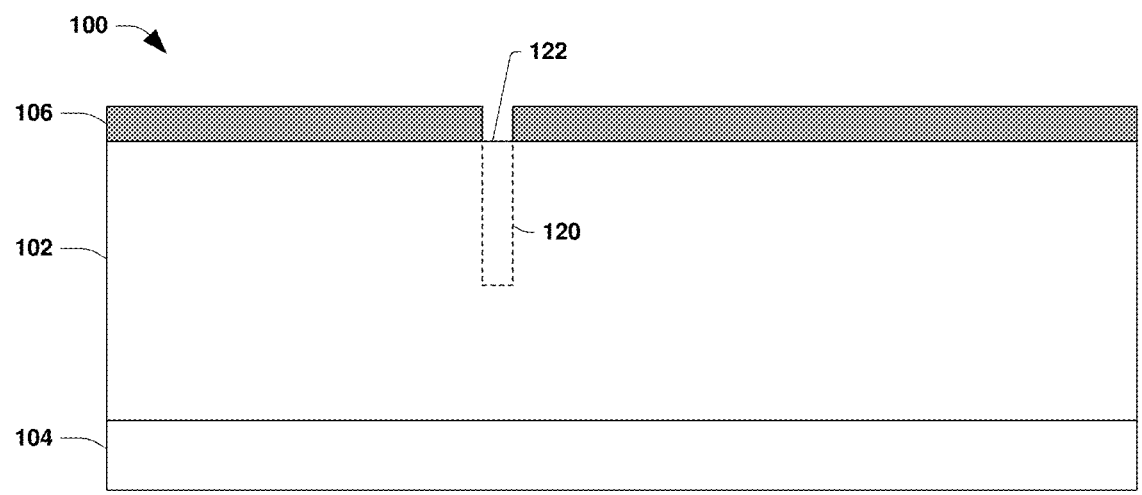

Referring to FIG. 3, the first area 118 of the barrier layer 106 is etched away to expose an upper surface 122 of the first region 120 of the substrate 102. The first area 118 of the barrier layer 106 may be etched away by at least one of plasma etching, reactive ion etching (RIE), wet etching, or other suitable techniques. In some embodiments, the barrier layer 106 is etched through the application of hydrofluoric acid (HF) or other suitable material. The photoresist layer 110 is removed. The photoresist layer 110 may be removed by etching, washing, or other suitable techniques. In some embodiments, the photoresist layer 110 is removed by piranha etching by exposing the photoresist layer 110 to a mixture of acids.

Figure 4:
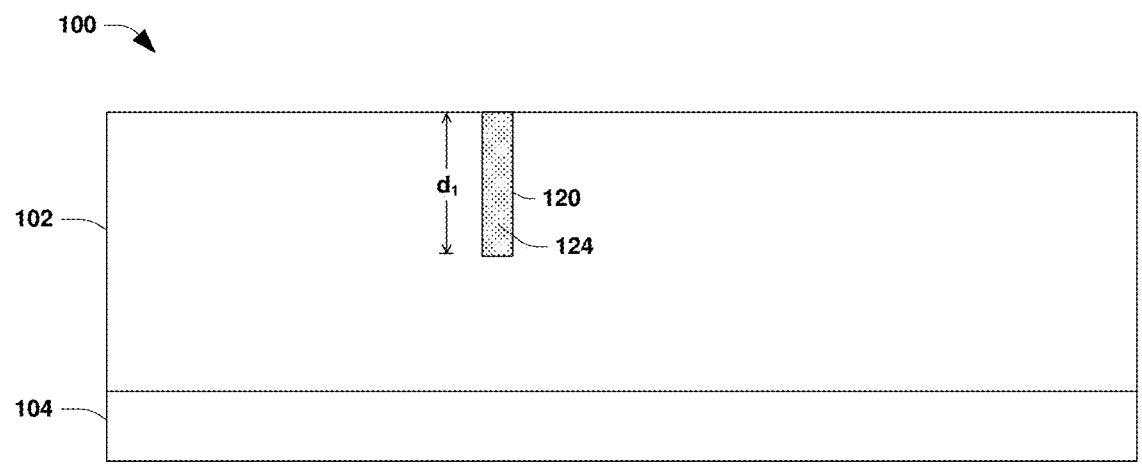

Referring to FIG. 4, the semiconductor arrangement 100 comprises a first well 124 in the first region 120 of the substrate 102. The first well 124 comprises at least one of p-type dopants or n-type dopants. The first well 124 is formed by at least one of ion implantation, molecular diffusion, or other suitable techniques. In some embodiments, a depth of dopants in the substrate 102 is controlled by increasing or decreasing a voltage used to direct the dopants into the substrate 102. The first well 124 may be formed to a first depth $d_1$ in the substrate 102. After the first well 124 is formed in the substrate 102 the barrier layer 106 may be removed by etching, chemical-mechanical polishing (CMP), or other suitable processes. Other configurations of the first well 124 are within the scope of the present disclosure.

Figure 5:
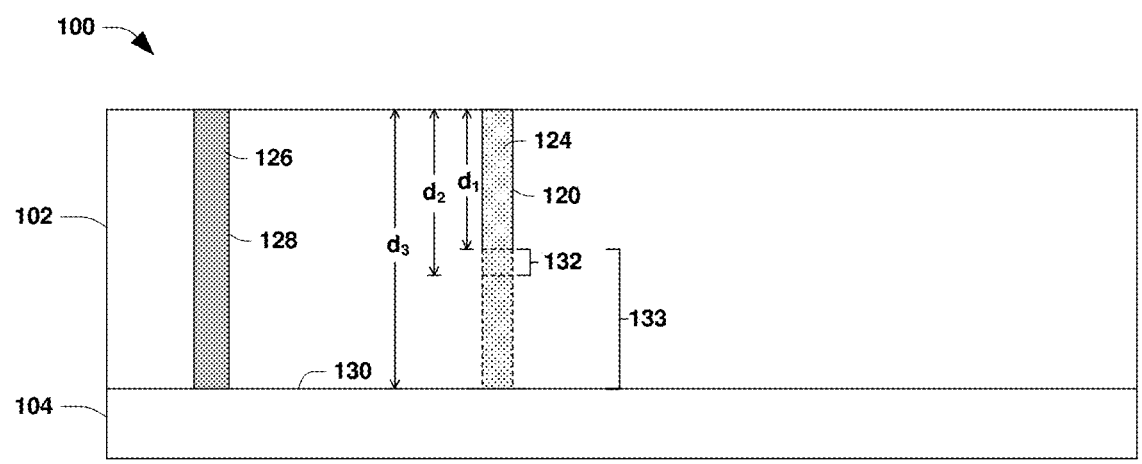

Referring to FIG. 5, the semiconductor arrangement 100 comprises an isolation structure 126 at least partially within the substrate 102. The isolation structure 126 is bordered by least one of a first surface 128 or a second surface 130 of the substrate 102. The second surface 130 may correspond to an upper surface of the buried oxide layer 104. In some embodiments, a recess is formed, such as etched, in the substrate 102 and the isolation structure 126 is formed in the recess by at least one of PVD, sputtering, CVD, LPCVD, ALCVD, UHVCVD, RPCVD, atomic layer deposition (ALD), MBE, LPE, spin on, growth, or other suitable techniques. In some embodiments, the isolation structure 126 comprises at least one of the materials listed above with respect to the materials of the barrier layer 106. In some embodiments, a type of material of the isolation structure 126 is a same type of material as a type of material of the barrier layer 106. In some embodiments, a type of material of the isolation structure 126 is different than a type of material of the barrier layer 106. The isolation structure 126 may be a shallow trench isolation (STI) structure. Other configurations of the isolation structure 126 are within the scope of the present disclosure.

In some embodiments, a drive-in process is performed to drive dopants of the first well 124 into a deeper region of the substrate 102. In some embodiments, the drive-in process increases the depth of the first well 124 from a first depth $d_1$ to a second depth $d_2$ corresponding to a depth of a second region 132 in the substrate 102. In some embodiments, the drive-in process increases the depth of the first well 124 from the first depth $d_1$ to a third depth $d_3$ corresponding to a depth of a third region 133 of the substrate 102. The third region 133 may be bordered by the second surface 130 of the substrate 102. The drive-in process may include subjecting the substrate 102 to a temperature within a range of 900° C. to 1000° C. for a time period within a range of one minute to a few tens of minutes. Other configurations of the first well 124 are within the scope of the present disclosure.

Figure 6:
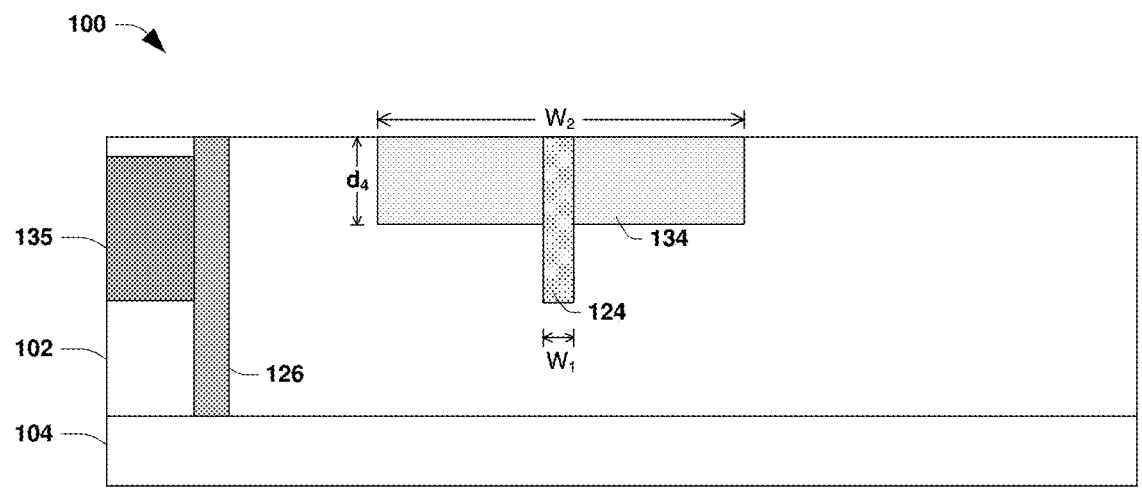

Referring to FIG. 6, the semiconductor arrangement 100 comprises a second well 134 and a third well 135 in the substrate 102. A portion of the second well 134 overlaps the first well 124. The second well 134 and the third well 135 each comprise p-type dopants or n-type dopants. The type of dopants of the second well 134 or the third well 135 may be the same as or different than the type of dopants of the first well 124. In some embodiments, a concentration of the type of dopants of the first well 124 is greater than a concentration of the type of dopants of the second well 134 or the third well 135. The second well 134 or the third well 135 may be formed in a manner similar to or different than the manner in which the first well 124 is formed. For example, formation of the second well 134 or the third well 135 may include forming a barrier layer over the substrate, forming a photoresist layer over the barrier layer, exposing the photoresist layer to light, developing the photoresist layer, etching the barrier layer, removing the photoresist layer, and forming the second well 134 or the third well 135 by at least one of ion implantation, molecular diffusion, or other suitable techniques. According to some embodiments, the third well 135 attenuates the strength of electric field(s) that originate outside of the semiconductor arrangement 100 and the first well 124 electrically isolates a portion of the substrate 102 to the left/right of the first well 124 from a portion of the substrate 102 to the right/left of the first well 124.

The second well 134 may be formed in the first well 124 and in the substrate 102 at opposite sides of the first well 124. The second well 134 may be formed to a fourth depth $d_4$ in the substrate 102. The depth of the second well 134 may be controlled by increasing or decreasing a voltage used to direct the dopants of the second well 134 into the substrate 102. In some embodiments, the first depth $d_1$ is greater than the fourth depth $d_4$. In some embodiments, the width $W_2$ of the second well 134 is the same distance as the width $W_1$ of the first well 124. In some embodiments, the width $W_2$ of the second well 134 is different than the width $W_1$ of the first well 124. The width $W_2$ of the second well 134 may be greater than or less than the width $W_1$ of the first well 124. Other configurations of the second well 134 are within the scope of the present disclosure.

Figure 7:
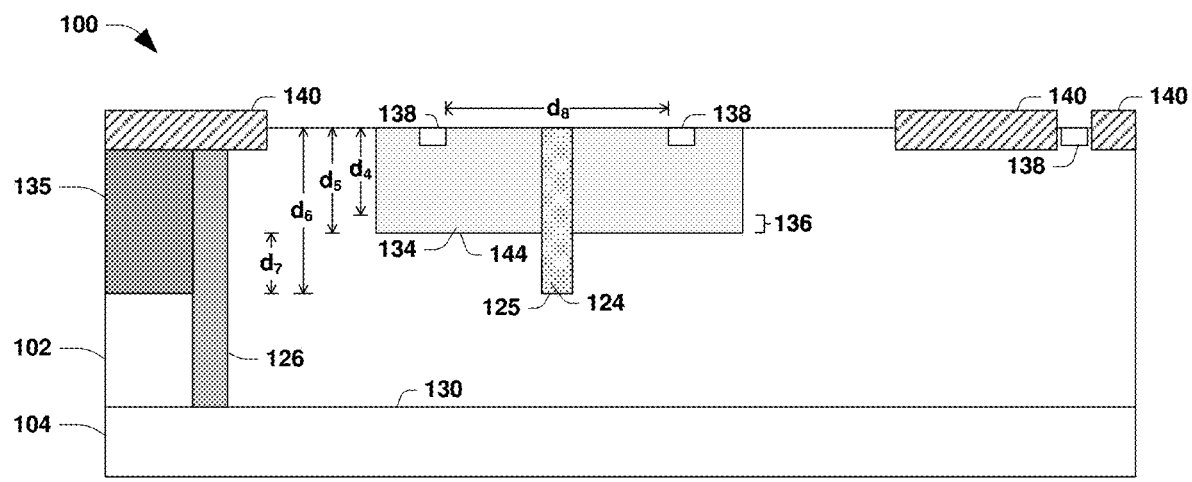

Referring to FIG. 7, in some embodiments a drive-in process is performed to drive dopants of the second well 134 into a fourth region 136 of the substrate 102. The drive-in process increases the depth of the second well 134 from the fourth depth $d_4$ to a fifth depth $d_5$. The drive-in process may include subjecting the substrate 102 to a temperature within a range of 900° C. to 1000° C. for a time period within a range of one minute to a few tens of minutes. A sixth depth $d_6$ of the first well 124 is greater than the fourth depth $d_4$ and the fifth depth $d_5$. The sixth depth $d_6$ of the first well 124 may correspond to the first depth $d_1$, the second depth $d_2$, the third depth $d_3$, or other suitable depth. The sixth depth $d_6$ is a distance $d_7$, measured from a lower surface 144 of the second well 134 to a lower surface 125 of the first well 124, greater than the fifth depth $d_5$. In some embodiments, $d_7$ is greater than 0 micrometers. In some embodiments, $d_7$ is a distance measured from the lower surface 144 of the second well 134 to the second surface 130 of the substrate 102. It is to be appreciated that although the instant application describes the second well 134 as being formed after the first well 124, in some embodiments, the second well 134 is formed before the first well 124.

The semiconductor arrangement 100 comprises conductive regions 138 at least one of over the substrate 102 or in the substrate 102. In some embodiments, at least two conductive regions 138 are within the second well 134 and separated by a distance $d_8>0$ millimeters. In some embodiments, a first conductive region of the at least two conductive regions 138 is to a first side of the first well 124 and a second conductive region of the at least two conductive regions 138 is to a second side of the first well 124, opposite the first side. In some embodiments, the conductive regions 138 are one of a source region or a drain region and comprise dopants implanted into the substrate 102. Some of the conductive regions 138 may comprise an n-type dopant. According to some embodiments, some of the conductive regions 138 comprise at least one of Phosphorus (P), Arsenic (As), Antimony (Sb), at least one Group V element, or other suitable material. Some of the conductive regions 138 may comprise a p-type dopant. According to some embodiments, some of the conductive regions 138 comprise at least one of Boron (B), Aluminum (Al), Gallium (Ga), Indium (In), at least one Group III element, or other suitable material.

The conductive regions 138 may comprise a different dopant type than the dopant type of the first well 124 or the second well 134. The conductive regions 138 may comprise a dopant concentration different than a dopant concentration of the first well 124 or the second well 134. The conductive regions 138 may comprise a same dopant type as the dopant type of the first well 124 or the second well 134. The conductive regions 138 may comprise a dopant concentration the same as a dopant concentration of the first well 124 or the second well 134.

All, some, or none of the conductive regions 138 may comprise a drain region or a source region. All, some, or none of the conductive regions 138 may comprise fin structures. Some conductive regions 138 may be epitaxy structures. Some conductive regions 138 may comprise silicon (Si), silicon phosphorus (SiP), silicon carbide phosphorus (SiCP), gallium antimony (GaSb), silicon germanium (SiGe), germanium (Ge), germanium tin (GeSn), or silicon germanium (SiGe).

The semiconductor arrangement 100 comprises an oxide layer 140, such as a field oxide (FOX) formed at least one of over or in the substrate 102. The oxide layer 140 may be formed between at least some of the conductive regions 138. According to some embodiments, the oxide layer 140 is formed by at least one of etching, implantation, PVD, sputtering, CVD, LPCVD, ALCVD, UHVCVD, RPCVD, MBE, LPE, or other suitable techniques. The etching process may be at least one of a plasma etching process, a reactive ion etching (RIE) process, a wet etching process, a sputter-etching process, or other suitable techniques. The oxide layer 140 may be formed by depositing electrical insulation material over at least one of the isolation structure 126 or the substrate 102. The oxide layer 140 may be at least one of a field oxide layer, a shallow trench isolation (STI) structure, or a local oxidation of silicon (LOCOS). Other configurations of the oxide layer 140 are within the scope of the present disclosure.

Figure 8:
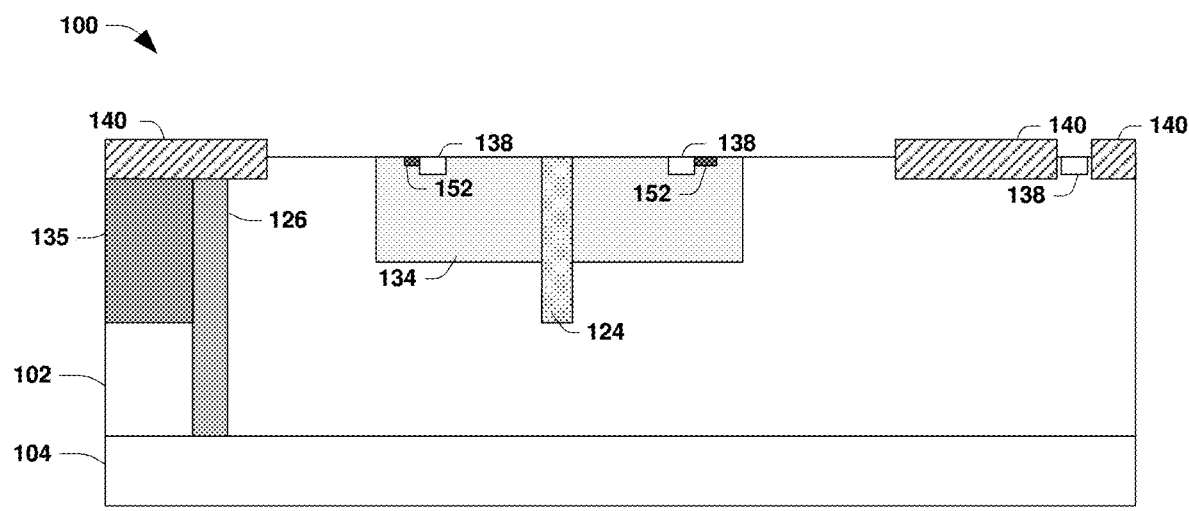

Referring to FIG. 8, in some embodiments the semiconductor arrangement 100 comprises lightly doped conductive regions 152 in the second well 134. The lightly doped conductive regions 152 may be adjacent to the conductive regions 138. The lightly doped conductive regions 152 may be at least one of n-type lightly doped drain regions, p-type lightly doped drain regions, n-type lightly doped source regions, or p-type lightly doped source regions. In some embodiments, the lightly doped conductive regions 152 may have the same conductivity type as the conductive regions 138. The lightly doped conductive regions 152 may be formed by ion implantation or other doping technique. Other configurations of the lightly doped conductive regions 152 are within the scope of the present disclosure.

Figure 9:
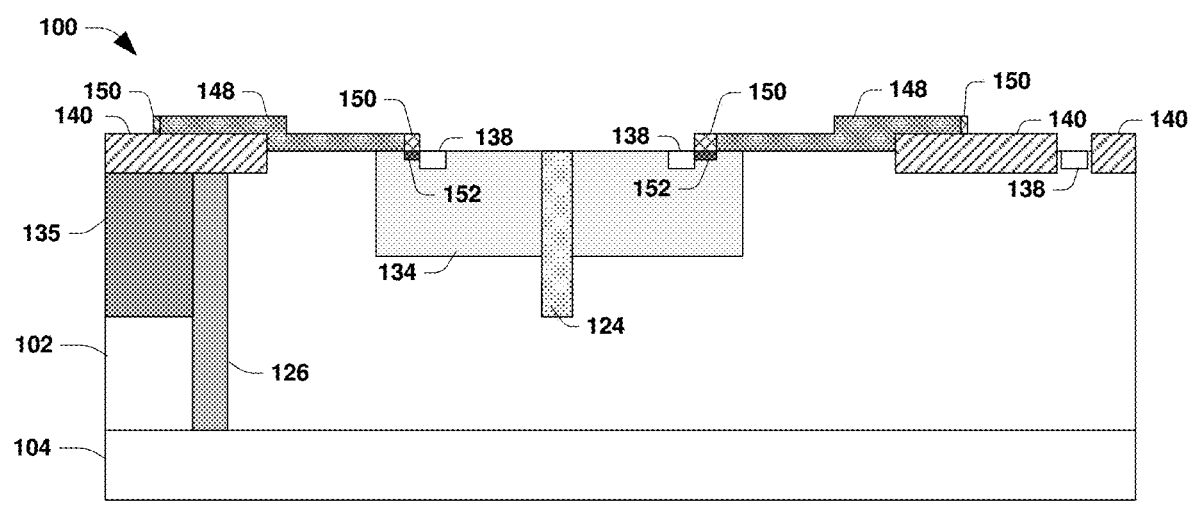

Referring to FIG. 9, the semiconductor arrangement 100 comprises a gate electrode 148. The gate electrode 148 may comprise a conductive material such as doped polysilicon, a metal, a metal alloy, and/or the like. In some embodiments, the gate electrode 148 overlies the substrate 102, the second well 134, and the oxide layer 140. The semiconductor arrangement 100 may include spacers 150, comprising a material such as silicon-oxynitride (SiON), silicon-oxycarbonitride (SiOCN), or other material, adjacent to the gate electrode 148. Other configurations of the gate electrode 148 are within the scope of the present disclosure.

Figure 10:
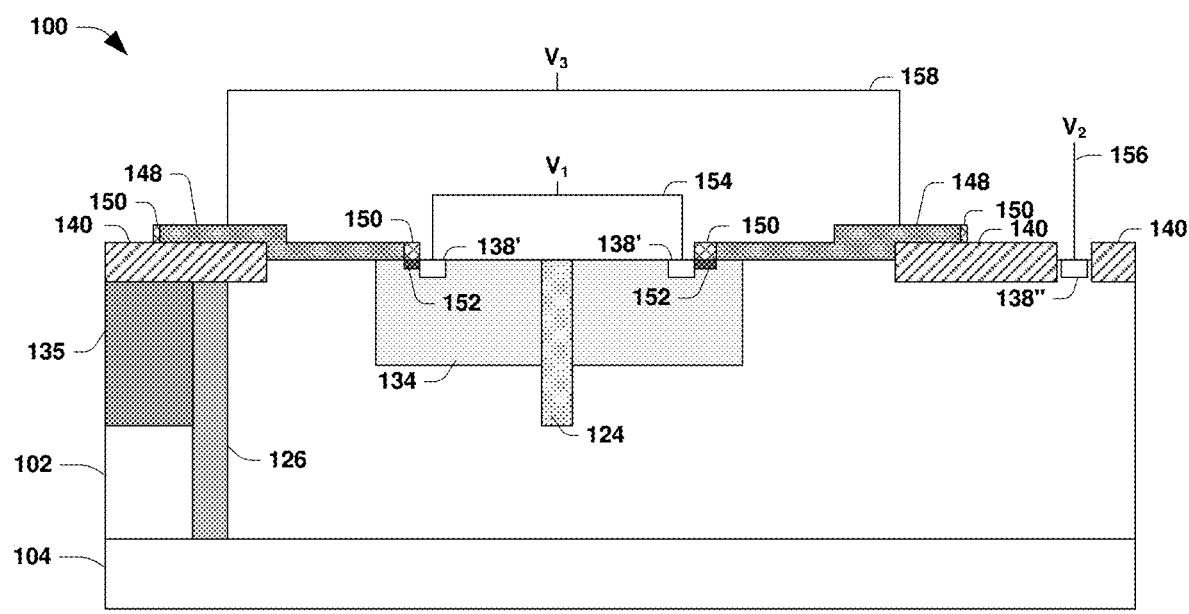

Referring to FIG. 10, the semiconductor arrangement 100 comprises a first conductor 154 electrically coupled to first conductive regions 138' of the conductive regions 138, a second conductor 156 electrically coupled to second conductive regions 138" of the conductive regions 138, and a third conductor 158 electrically coupled to the gate electrode (s) 148. The first conductor 154 is electrically coupled to a first voltage source $V_1$, the second conductor 156 is electrically coupled to a second voltage source $V_2$, and the third conductor 158 is electrically coupled to a third voltage source $V_3$. In some embodiments, the first voltage source $V_1$ corresponds to a source voltage, the second voltage source $V_2$ corresponds to a drain voltage, and the third voltage source $V_3$ corresponds to a gate voltage. In some embodiments, the second voltage source $V_2$ is around 500V. Other configurations of conductors and voltage sources of the semiconductor arrangement 100 are within the scope of the disclosure.

In some embodiments, the first conductive regions 138' are source regions and the second conductive regions 138" are drain regions. In some embodiments, the first conductive regions 138' are drain regions and the second conductive regions 138" are source regions. In some embodiments, the first conductor 154 may correspond to a cathode of an LIGBT and the second conductor 156 may correspond to an anode of an LIGBT. In some embodiments, the first conductor 154 may correspond to an anode of an LIGBT and the second conductor 156 may correspond to a cathode of an LIGBT. Other configurations of the first conductive regions 138', the second conductive regions 138", the first conductor 154, the second conductor 156, and the third conductor 158 are within the scope of the present disclosure.

Figure 11:
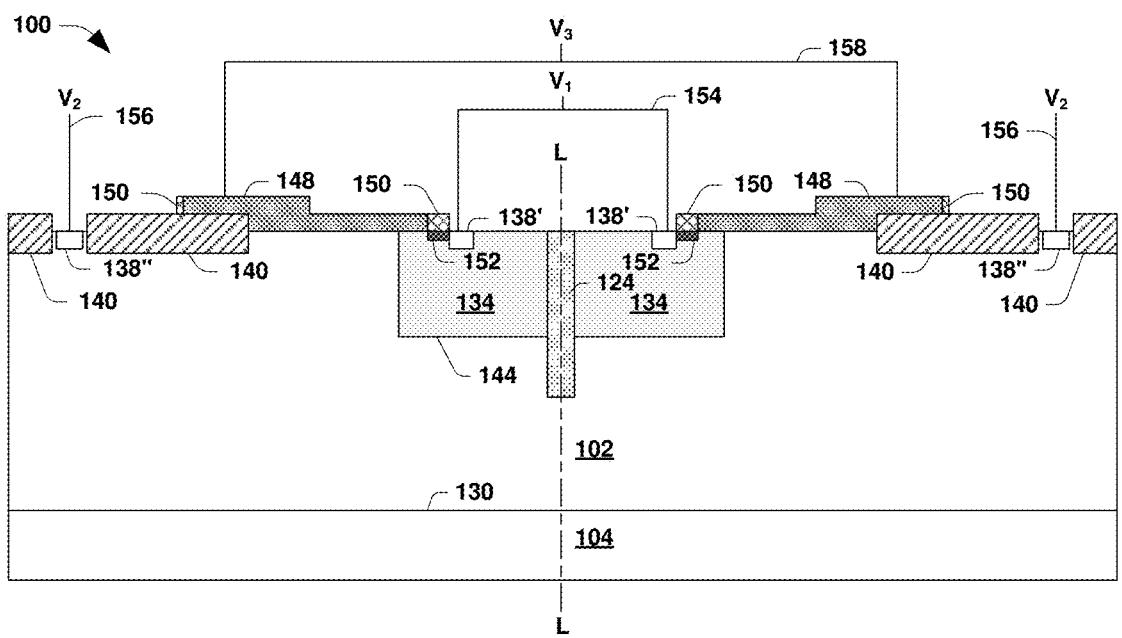

Referring to FIG. 11, in some embodiments similar types of regions of the semiconductor arrangement 100 are on each side of a depicted reference line L. For example, the semiconductor arrangement 100 may include first conductive regions 138' and second conductive regions 138" on each side of the reference line L. The second conductive regions 138" on each side of the reference line L may be between respective oxide layers 140 on each side of the reference line L.

In some embodiments, similar types of structures are on each side of the reference line L. For example, in FIG. 11 the types of structures to the left of the reference line L and the types of structures to the right of the reference line L are similar. In contrast, FIG. 10 illustrates an isolation structure 126 only to the left of the reference line L. In some embodiments, the reference line L is a center line of the semiconductor arrangement 100. Other configurations of regions and structures about a depicted reference line L are within the scope of the present disclosure.

Figure 12:
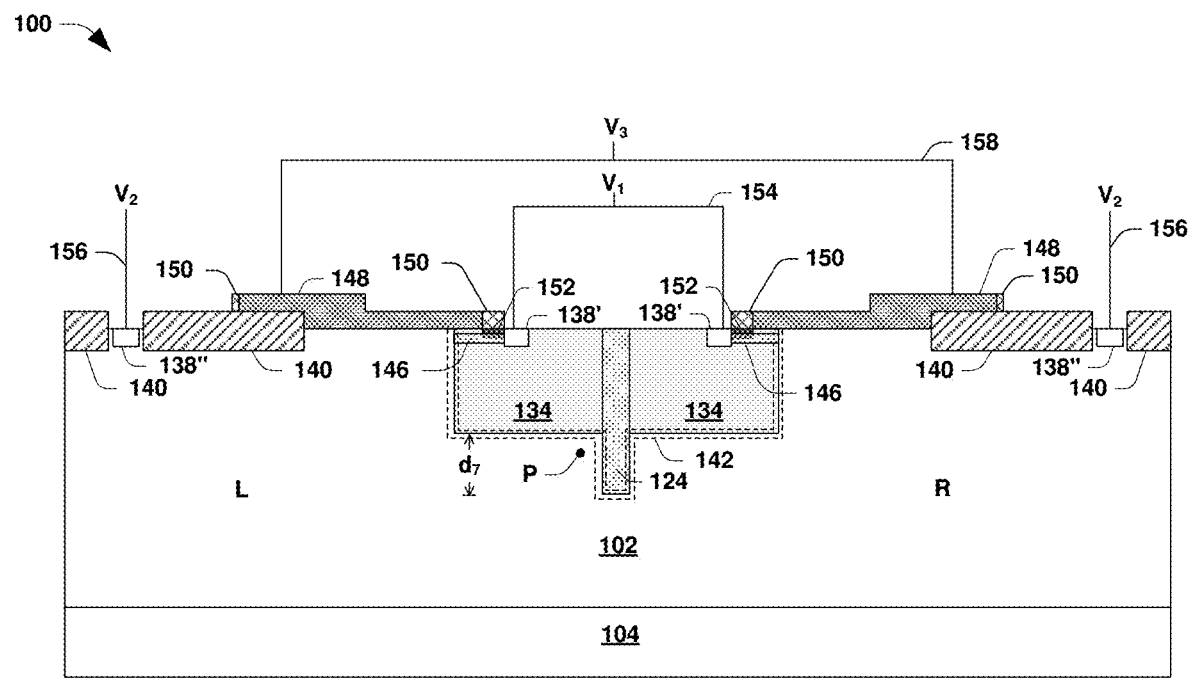

Referring to FIG. 12, inversion layers 146 form in the second well 134 when a voltage is applied to the gate electrodes 148. The inversion layers 146 are channel regions between the first conductive regions 138' and the substrate 102. The applied voltage generates current flow from the first conductive regions 138', through the inversion layers 146, through the substrate 102, and to the second conductive regions 138". Current flow into the substrate 102 generates an electric field in the substrate 102.

According to some embodiments, a p-n junction 142 at the interface of the first well 124 and the substrate 102 and at the interface of the second well 134 and the substrate 102 includes a depletion region. The depletion region is an insulation region that functions as a barrier to the electric field generated in the substrate 102. The barrier at least partially contains the electric field generated by each LIGBT to an area of the substrate 102 proximate the respective LIGBT, thereby reducing the strength of the electric field at areas within the substrate 102. For example, without the first well 124 the strength of the electric field at point "P" is due to the electric fields generated in the left (L) and right (R) regions of the substrate 102. With the first well 124, the strength of the electric field at point "P" is primarily due to the electric field generated in the left (L) region of the substrate 102. The electric field in the right (R) region of the substrate 102 is partially blocked by the first well 124 and therefore may at most marginally increase the strength of the electric field at point "P" in the left (L) region of the substrate 102. Without the first well 124, the strength of the electric field at point "P" may cause the p-n junction 142 to break down. With the first well 124, the strength of the electric field at point "P" is less than the strength of the electric field at point "P" without the first well 124, thereby diminishing the probability of p-n junction 142 breakdown.

The strength of the electric field in the substrate 102 is proportional to the strength of current from the first conductive regions 138' to the second conductive regions 138", and the strength of the electric field at point "P" is proportional to the strength of current from the first conductive regions 138' to the second conductive regions 138". Because the strength of the electric field at point "P" with the first well 124 is less than the strength of the electric field at point "P" without the first well 124, the inclusion of the first well 124 increases the breakdown voltage of the semiconductor arrangement 100. Increasing the breakdown voltage increases and improves the safe operating area (SOA) of the semiconductor arrangement 100. The improved SOA allows for increased voltage application of the semiconductor arrangement 100. According to some embodiments, the semiconductor arrangement 100 comprises a first LIGBT in the left (L) region of the substrate and a second LIGBT in the right (R) region of the substrate.

Figure 13:
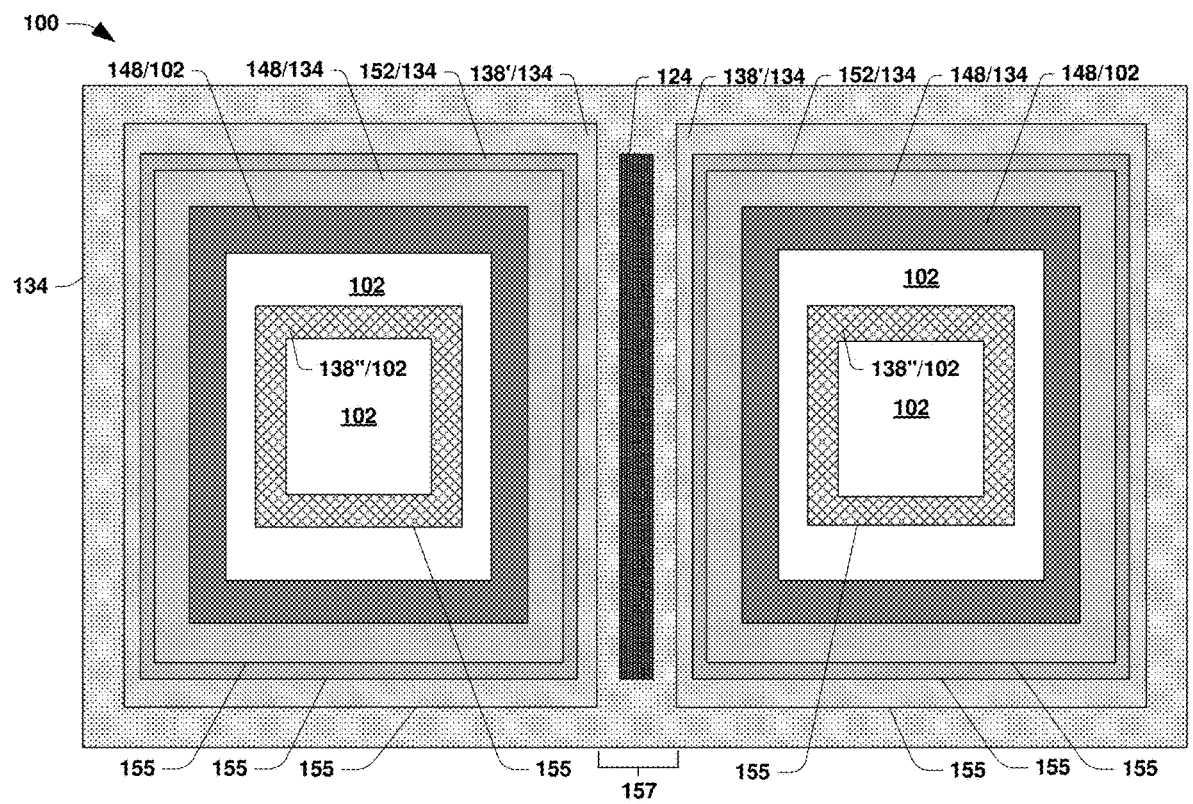
FIGS. 13-14 are top views of a semiconductor arrangement, according to some embodiments.
Figure 14:
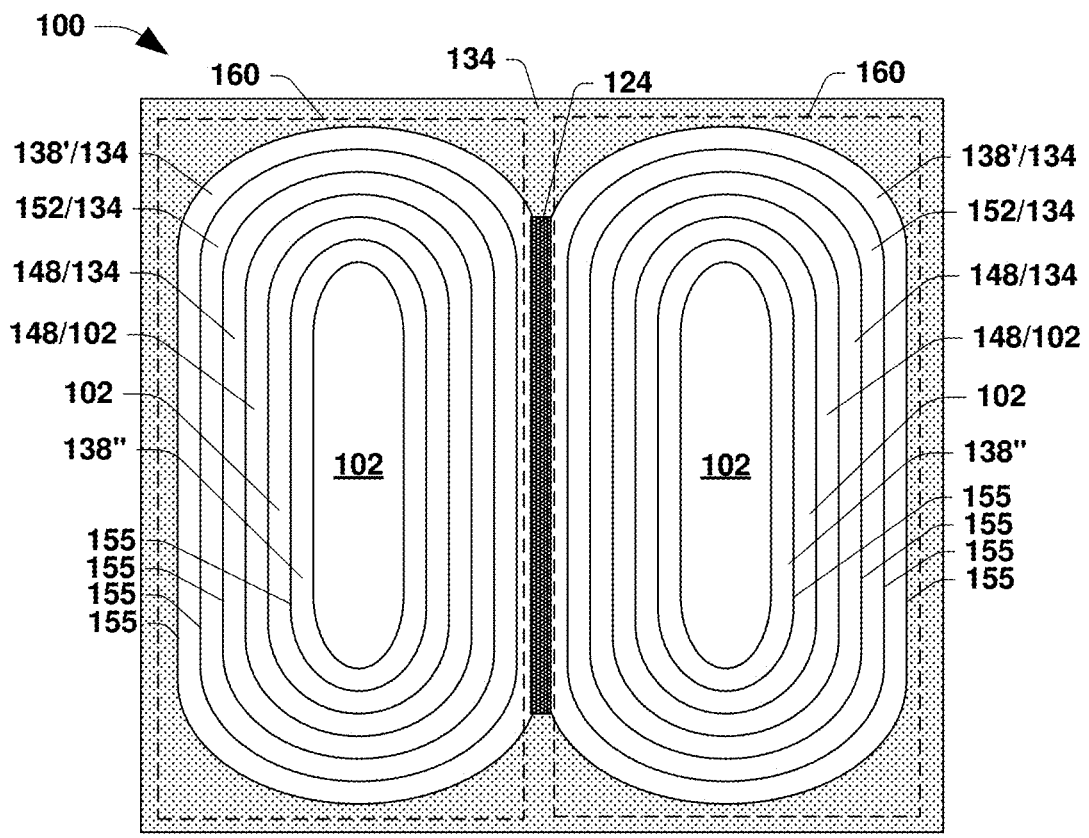

FIGS. 13-14 are top views of a semiconductor arrangement 100, according to some embodiments.

Referring to FIG. 13, in some embodiments of the semiconductor arrangement 100 the shapes of the first conductive regions 138', the lightly doped conductive regions 152, the gate electrodes 148, and the second conductive regions 138" are respective rings 155. The rings of the first conductive regions 138' encircle the lightly doped conductive regions 152, the rings of the lightly doped conductive regions 152 encircle the gate electrodes 148, and the rings of the gate electrodes 148 encircle the second conductive regions 138". Each of the first conductive regions 138', the lightly doped conductive regions 152, and the gate electrodes 148 overlies a portion of the second well 134. Each of the rings of the gate electrodes 148 and the second conductive regions 138" overlies the substrate 102. The first well 124 is implanted in a region 157 of the second well 134 that is between the rings 155. The oxide layer 140 and the spacers 150 are not illustrated for clarity. The rings 155 are illustrated as comprising linear sides. Other configurations and shapes of the rings 155 are within the scope of the present disclosure.

Referring to FIG. 14, in some embodiments of the semiconductor arrangement 100 each of the rings 155 is elliptical. The vertical layering depicted in FIG. 13 is not depicted in FIG. 14 for clarity.

FIG. 14 illustrates LIGBTs 160 comprising adjacent first conductive regions 138'. In some embodiments, the first conductive regions 138' of each LIGBT of the LIGBTs 160 are source regions. In some embodiments, the first conductive regions 138' of each LIGBT of the LIGBTs 160 are drain regions. In some embodiments, the first conductive regions 138' of each LIGBT of the LIGBTs 160 are coupled to a same conductor (such as the first conductor 154 illustrated in FIG. 12 (not shown in FIG. 14)). In some embodiments, the first well 124 is between first conductive regions 138' of adjacent LIGBTs 160. The first well 124 may extend lengthwise along adjacent first conductive regions 138'. Other configurations of the rings 155, the LIGBTs 160, the first conductive regions 138', or the first well 124 are within the scope of the present disclosure.

In some embodiments, each LIGBT of the LIGBTs 160 comprises the substrate 102. In some embodiments, each LIGBT of the LIGBTs 160 comprises a respective second conductive region 138" adjacent to the substrate 102. In some embodiments, the second conductive regions 138" of each LIGBT of the LIGBTs 160 are source regions. In some embodiments, the second conductive regions 138" of each LIGBT of the LIGBTs 160 are drain regions. In some embodiments, the second conductive regions 138" of each LIGBT of the LIGBTs 160 are coupled to a same conductor (such as the second conductor 156 illustrated in FIG. 12 (not shown in FIG. 14)). Other configurations of the substrate 102 and the second conductive regions 138" are within the scope of the present disclosure.

Figure 15A:
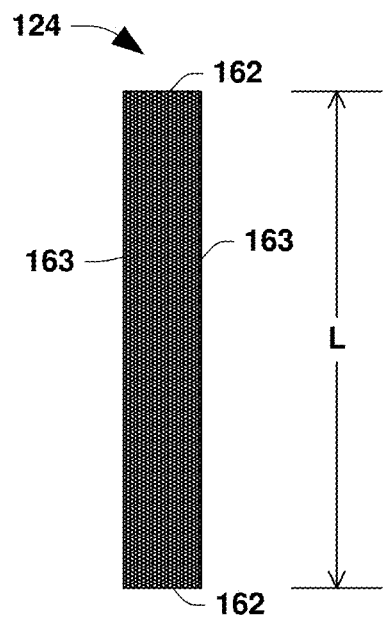
FIGS. 15A-15B illustrate versions of a well of a semiconductor arrangement, according to some embodiments.
Figure 15B:
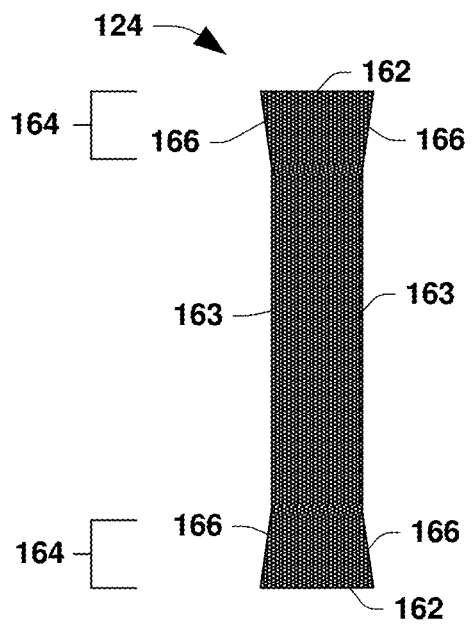

FIGS. 15A-15B illustrate versions of the first well 124 of the semiconductor arrangement 100, according to some embodiments.

Referring to FIG. 15A, the first well 124 may be rectangular-shaped having first side surfaces 162 and second side surfaces 163. The second side surfaces 163 are perpendicular to the first side surfaces 162. The first side surfaces 162 may be referred to at times as a top surface and a bottom surface. In some embodiments, a length L of the first well 124 is a same length as a length of the shared portions of the first conductive regions 138'. In some embodiments, the length L of the first well 124 is a different length than the length of the shared portions of the first conductive regions 138'. In some embodiments, the length L of the first well 124 is greater than the length of the shared portions of the first conductive regions 138'. In some embodiments, the length L of the first well 124 is less than the length of the shared portions of the first conductive regions 138'.

Referring to FIG. 15B, the first well 124 may comprise tapered regions 164 defined by slanted side surfaces 166. The tapered regions 164 may be at or near the first side surfaces 162. The tapered regions 164 may be between the first side surfaces 162 and the second side surfaces 163. The tapered regions 164 may be between shared portions of the first conductive regions 138'. The tapered regions 164 may extend beyond shared portions of the first conductive regions 138'. Other shapes and dimensions of the first well 124 are within the scope of the present disclosure.

FIGS. 16A-16C, 17, and 18 are top views of the semiconductor arrangement 100, according to some embodiments.

Figure 16A:
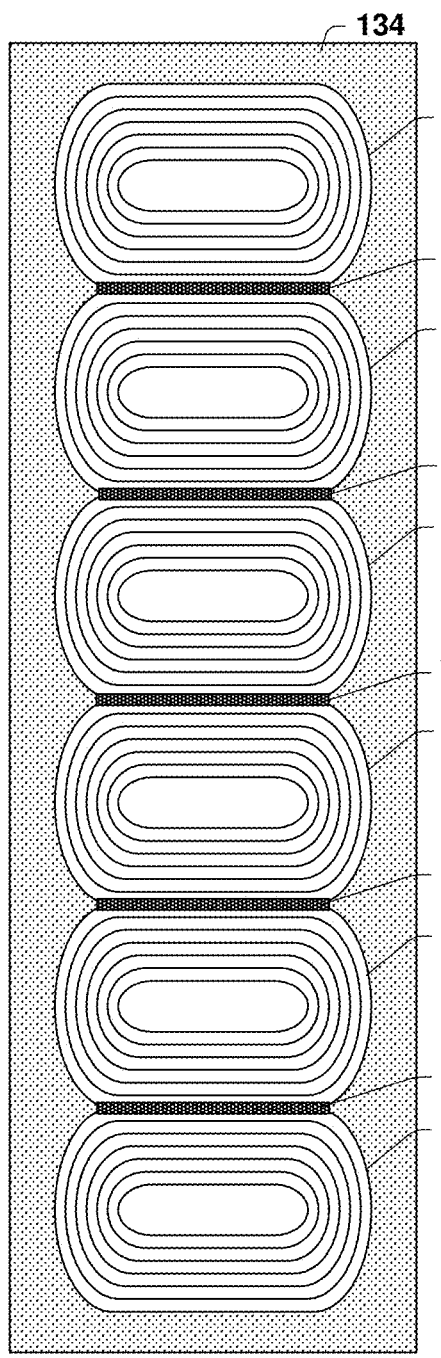
FIGS. 16A-16C, 17, and 18 are top views of a semiconductor arrangement, according to some embodiments.
Figure 16B:
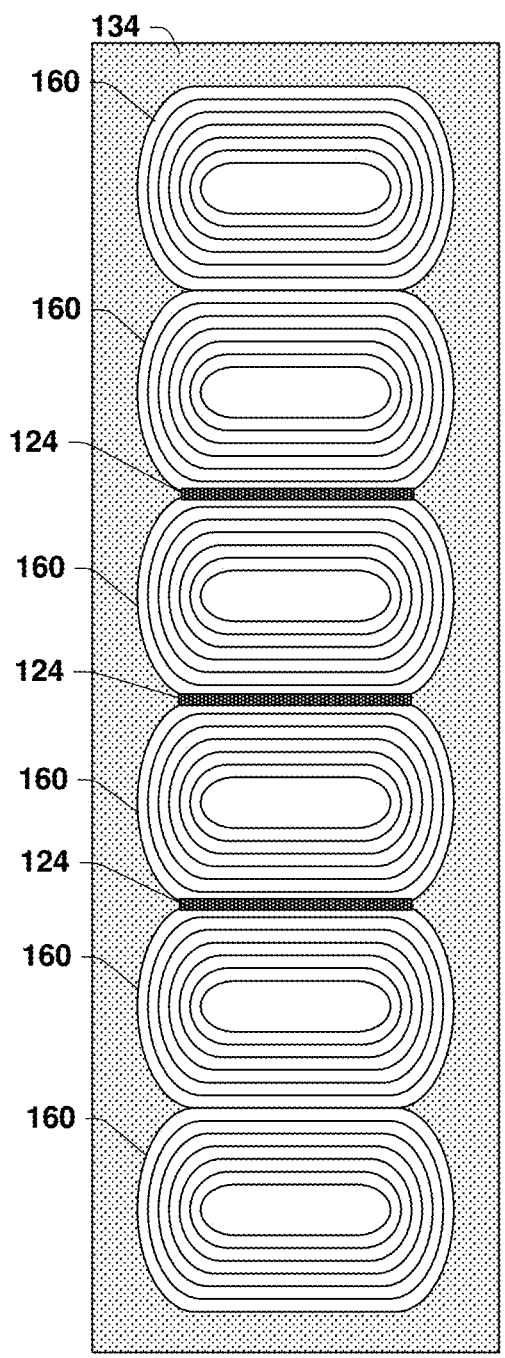
Figure 16C:
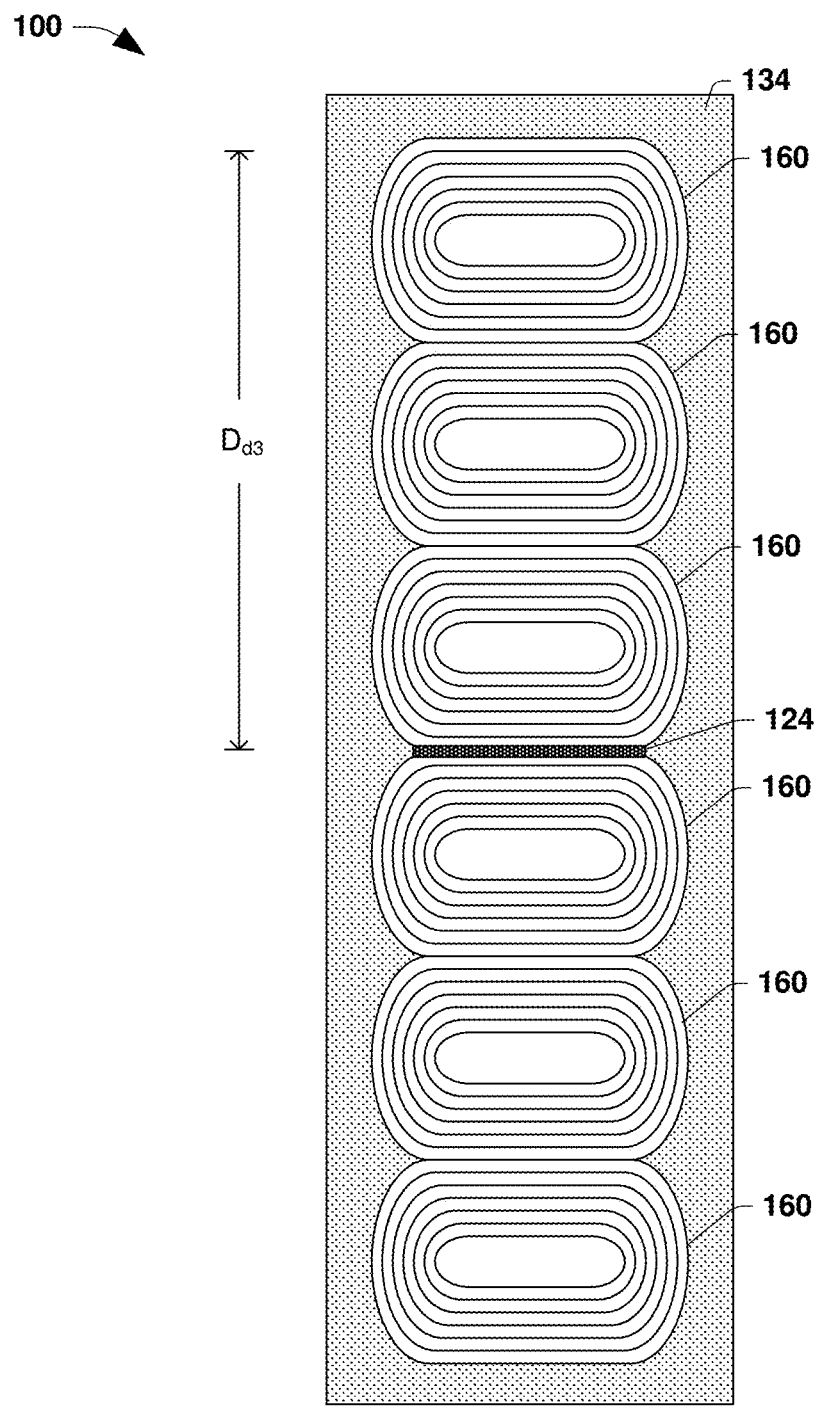

FIGS. 16A-16C each illustrate a plurality of parallel connected LIGBTs 160 and the second well 134. FIG. 16A illustrates an embodiment of the semiconductor arrangement 100 comprising first wells 124 between all adjacent LIGBTs 160. FIG. 16A illustrates that the greatest distance from a first well of the first wells 124 to the second well 134 is $D_{d1}$. FIG. 16B illustrates an embodiment of the semiconductor arrangement 100 comprising first wells 124 between some adjacent LIGBTs 160. FIG. 16B illustrates that the greatest distance from a first well of the first wells 124 to the second well 134 is $D_{d2}$. According to some embodiments, $D_{d1} < D_{d2}$. FIG. 16C illustrates an embodiment of the semiconductor arrangement 100 comprising a first well 124 between only two adjacent LIGBTs of the LIGBTs 160. FIG. 16C illustrates that the greatest distance from a first well of the first wells 124 to the second well 134 is $D_{d3}$. According to some embodiments, $D_{d3} > D_{d2}$. The distances $D_{dx}$, where x is 1, 2, or 3, each correspond to the depletion distance of the semiconductor arrangement 100. A shorter depletion distance may correspond to faster depletion in the substrate 102 between switching cycles. Faster depletion in the substrate 102 between switching cycles may correspond to a greater safe operating area (SOA) of the semiconductor arrangement 100 by, for example, increasing the breakdown voltage of the LIGBTs 160 by providing a shorter depletion distance. Other configurations of the plurality of parallel connected LIGBTs 160, the first wells 124, and the second wells 134 are within the scope of the present disclosure.

Figure 17:
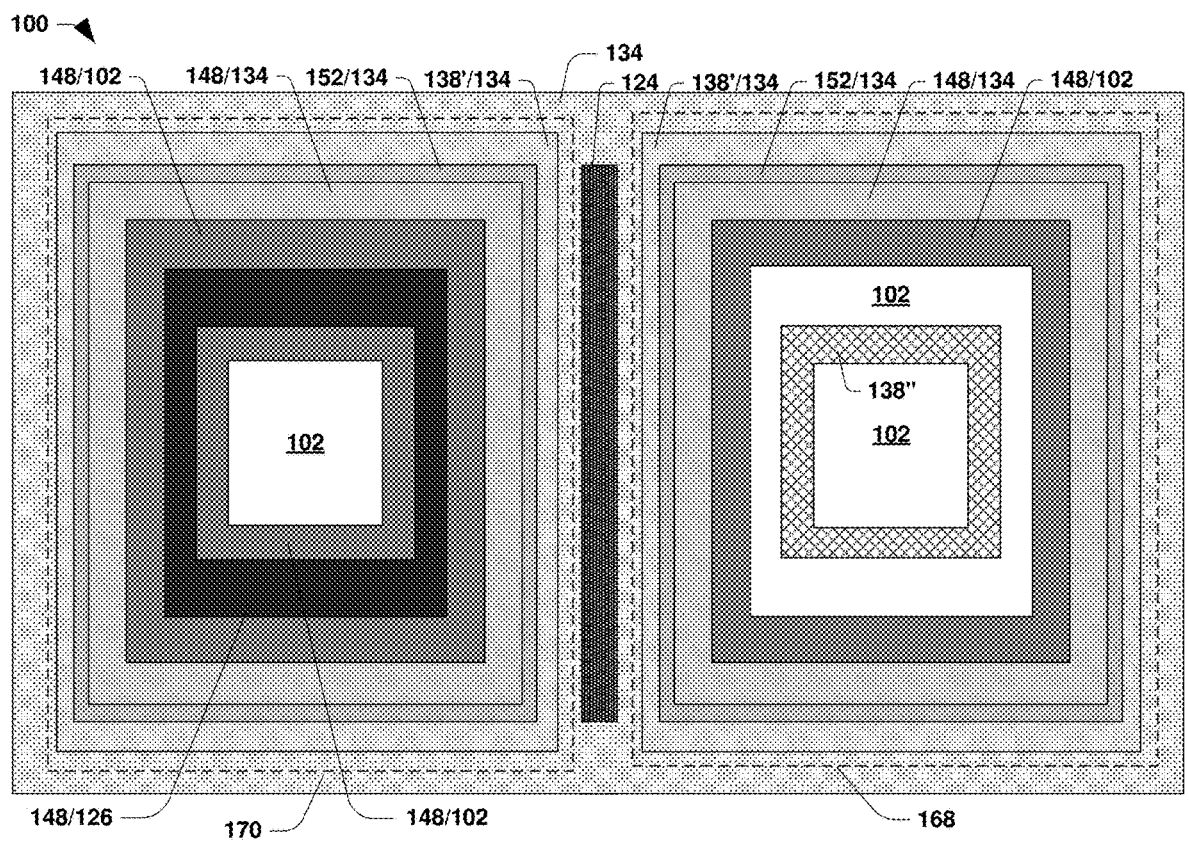

Referring to FIG. 17, the semiconductor arrangement 100 comprises a first LIGBT 168 adjacent to a second LIGBT 170. The second LIGBT 170 comprises an isolation structure 126 under a portion of the gate electrode 148. In some embodiments, the semiconductor arrangement 100 of FIG. 17 corresponds to at least portions of the semiconductor arrangement 100 of FIG. 10, including the isolation structure 126. Other configurations of the first LIGBT 168 and the second LIGBT 170 are within the scope of the present disclosure.

Figure 18:
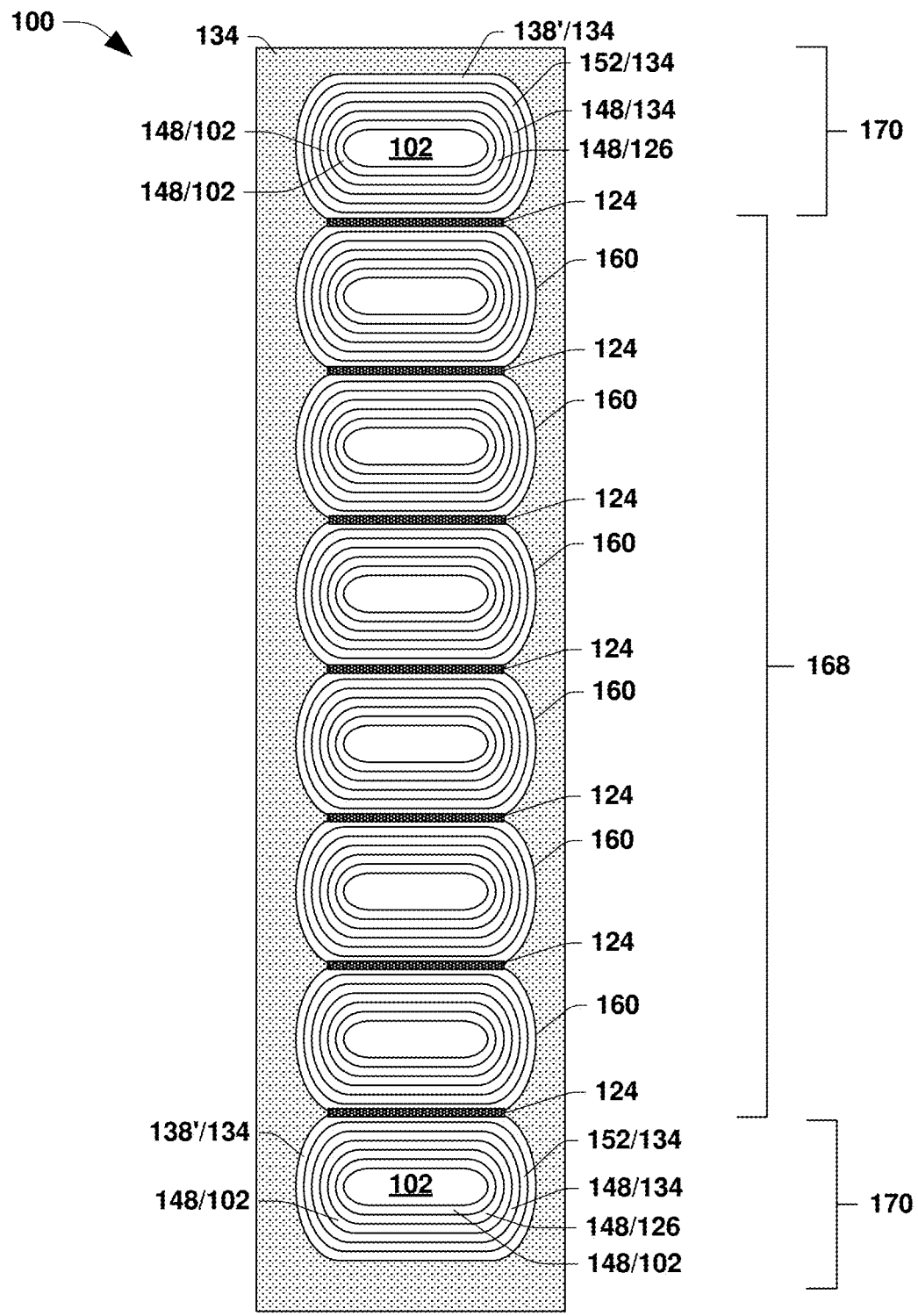

Referring to FIG. 18, the semiconductor arrangement 100 comprises a first plurality of parallel connected first LIGBTs 168 connected in parallel between two parallel connected second LIGBTs 170. Other configurations of the first plurality of parallel connected first LIGBTs 168 and the second LIGBTs 170 are within the scope of the present disclosure.

As disclosed, the p-n junction at the interface of the first well and the substrate functions as a barrier to the electric field generated in the substrate. The strength of the electric field at a point "P" in the substrate is proportional to the strength of current from the first conductive regions to the second conductive regions. Because the strength of the electric field at point "P" with the first well in the substrate is less than the strength of the electric field at point "P" without the first well in the substrate, the inclusion of the first well increases the breakdown voltage of the semiconductor arrangement, thereby improving the safe operating area as compared to arrangements that do not include the first well.

According to some embodiments, a method of forming a semiconductor arrangement includes forming a first well to a first depth and a first width in a substrate and forming a second well to a second depth and a second width in the substrate. According to some embodiments, the second well surrounds the first well, the first depth is greater than the second depth, and the second width is greater than the first width.

According to some embodiments, the first depth is at least 0.1 micrometers greater than the second depth.

According to some embodiments, the method of forming the semiconductor arrangement includes driving dopants of the first well from the first depth in the substrate to a third depth in the substrate by subjecting the substrate to a dopant drive-in condition.

According to some embodiments, the dopant drive-in condition includes a temperature within a range of 900° Celsius to 1000° Celsius.

According to some embodiments, the method of forming the semiconductor arrangement includes forming a buried oxide layer in the substrate, forming the first well includes forming the first well to a third depth in the substrate, and the third depth is a depth of an upper surface of the buried oxide layer.

According to some embodiments, the method of forming the semiconductor arrangement includes forming a first conductive region in the second well and forming a second conductive region in the substrate.

According to some embodiments, forming the first conductive region includes doping the substrate with a first dopant type and the first dopant type is a different dopant type than a dopant type of the second well.

According to some embodiments, the method of forming the semiconductor arrangement includes forming a first conductive region within the second well and to a first side of the first well and forming a second conductive region within the second well and to a second side of the first well, opposite the first side.

According to some embodiments, forming the second well includes forming the second well in the substrate at opposite sides of the first well.

According to some embodiments, the first well is formed with a first dopant type, the second well is formed with a second dopant type, and the second dopant type is a same dopant type as the first dopant type.

According to some embodiments, a concentration of the first dopant type is greater than a concentration of the second dopant type.

According to some embodiments, a semiconductor arrangement includes a substrate, a first well of a first dopant type in the substrate, and a second well of a second dopant type in the substrate. According to some embodiments, a depth of the first well is a first depth and a width of the first well is a first width, a depth of the second well is a second depth and a width of the second well is a second width, the first dopant type is a same dopant type as the second dopant type, the first depth is greater than the second depth, and the second width is greater than the first width.

According to some embodiments, the semiconductor arrangement includes a first conductive region within the second well and at a first side of the first well and a second conducive region within the second well and at a second side of the first well. According to some embodiments, the first side of the first well is opposite the second side of the first well.

According to some embodiments, a third dopant type of the first conductive region is different than the first dopant type and the second dopant type.

According to some embodiments, the first conductive region and the second conductive region are both either source regions or drain regions.

According to some embodiments, the substrate includes a buried oxide layer and the first depth is a depth to an upper surface of the buried oxide layer.

According to some embodiments, a semiconductor arrangement includes a substrate, a first well of a first dopant type in the substrate, a second well of the first dopant type in the substrate, a source region of a second dopant type in the second well, and a drain region of the second dopant type in the substrate. According to some embodiments, the second dopant type is different than the first dopant type, a depth of the first well in the substrate is greater than a depth of the second well in the substrate, and the source region is between the first well and the drain region.

According to some embodiments, a width of the second well is greater than a width of the first well.

According to some embodiments, the semiconductor arrangement includes an oxide layer overlying the substrate and a gate electrode overlying the oxide layer.

According to some embodiments, the source region encircles the drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor arrangement, comprising:

forming a first well to a first depth and a first width in a substrate;
forming a second well to a second depth and a second width in the substrate, wherein:
the second well surrounds the first well,
the first depth is greater than the second depth, and
the second width is greater than the first width;
forming a plurality of first conductive regions in the second well, wherein:
the first well is arranged within an area between two adjacent first conductive regions of the plurality of first conductive regions,
the plurality of first conductive regions are separated from the first well by the second well,
each of the plurality of first conductive regions form a loop,
each of the plurality of first conductive regions is a source region or drain region, and
the first well is disposed outside an outer perimeter of the loop formed by each of the plurality of first conductive regions; and
forming a doped region laterally adjacent at least one of the plurality of first conductive regions.

2. The method of claim 1, wherein the first depth is at least 0.1 micrometers greater than the second depth.

3. The method of claim 1, comprising:
driving dopants of the first well from the first depth in the substrate to a third depth in the substrate by subjecting the substrate to a dopant drive-in condition.

4. The method of claim 3, wherein the dopant drive-in condition comprises a temperature within a range of 900° Celsius to 1000° Celsius.

5. The method of claim 1, comprising:
forming a buried oxide layer in the substrate, wherein:
forming the first well comprises forming the first well to a third depth in the substrate, and
the third depth is a depth of an upper surface of the buried oxide layer.

6. The method of claim 1, comprising:
forming a second conductive region in the substrate, wherein the second conductive region is spaced apart from the second well.

7. The method of claim 1, wherein:
forming the plurality of first conductive regions comprises doping the substrate with a first dopant type, and
the first dopant type is a different dopant type than a dopant type of the second well.

8. The method of claim 1, wherein:
forming the plurality of first conductive regions comprises forming the first conductive region to a first side of the first well, and
the method comprises forming a second conductive region within the second well and to a second side of the first well, opposite the first side, wherein the second conductive region is separated from the first well by the second well.

9. The method of claim 1, wherein forming the second well comprises forming the second well in the substrate at opposite sides of the first well.

10. The method of claim 1, wherein:
the first well is formed with a first dopant type,
the second well is formed with a second dopant type, and
the second dopant type is a same dopant type as the first dopant type.

11. The method of claim 10, wherein a concentration of the first dopant type is greater than a concentration of the second dopant type.

12. A method of forming a semiconductor arrangement for a lateral insulated-gate bipolar transistor, comprising:
forming a first well in a substrate;
forming an isolation structure in the substrate after forming the first well, wherein:
the isolation structure extends from a top surface of the substrate to a bottom surface of the substrate,
the isolation structure forms a loop, and
the first well is disposed outside an outer perimeter of the loop; and
forming a second well and a third well in the substrate after forming the isolation structure, wherein:
the second well surrounds the first well and the isolation structure,
the isolation structure is between the second well and the third well,
the first well has a first depth,
the second well has a second depth, and
the second depth is less than the first depth.

13. The method of claim 12, comprising:
forming an oxide layer overlying the isolation structure and the third well.

14. The method of claim 12, comprising:
forming a conductive region in the second well between the first well and the isolation structure.

15. The method of claim 14, wherein:
the conductive region comprises a first doped region; and
the method comprises forming a second doped region adjacent the first doped region and between the first doped region and the isolation structure.

16. The method of claim 15, wherein the first doped region has a first concentration of dopants and the second doped region has a second concentration of dopants less than the first concentration of dopants.

17. A method of forming a semiconductor arrangement, comprising:
forming a first well to a first depth in a substrate;
forming a second well to a second depth in the substrate, wherein:
the second well surrounds the first well, and
the first depth is greater than the second depth;
forming an oxide layer over the substrate;
forming a conductive region in the second well;
forming a doped region in the second well laterally adjacent the conductive region, wherein the conductive region is between the first well and the doped region;
forming a first spacer over the doped region; and
forming a first gate electrode and a second gate electrode overlying the oxide layer and the second well, wherein:
the first well is arranged within an area between the first gate electrode and the second gate electrode,
the first gate electrode extends from over the oxide layer to the first spacer,
the first gate electrode and the second gate electrode each forms a loop, and
the first well is disposed outside an outer perimeter of the loop formed by each of the first gate electrode and the second gate electrode.

18. The method of claim 17, comprising:
forming a second spacer over the oxide layer, wherein the first gate electrode extends from the second spacer to the first spacer.

19. The method of claim 17, comprising:
forming an isolation structure in the substrate prior to forming the oxide layer, wherein forming the oxide layer comprises forming the oxide layer to overlie the isolation structure.

20. The method of claim 17, wherein:
the first well has a first width,
the second well has a second width, and
the second width is greater than the first width.

\* \* \* \* \*